(12) United States Patent
Yoshimine et al.

(10) Patent No.: US 9,059,358 B2
(45) Date of Patent: Jun. 16, 2015

(54) SOLAR CELL MODULE AND METHOD OF MANUFACTURING THE SAME

(75) Inventors: Yukihiro Yoshimine, Kobe (JP); Hiroshi Kanno, Kobe (JP); Haruhisa Hashimoto, Minoh (JP); Atsushi Saita, Kobe (JP); Shigeharu Taira, Amagasaki (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 344 days.

(21) Appl. No.: 12/344,754

(22) Filed: Dec. 29, 2008

(65) Prior Publication Data
US 2010/0018563 A1 Jan. 28, 2010

(30) Foreign Application Priority Data
Dec. 27, 2007 (JP) .................................. 2007-338138

(51) Int. Cl.
*H01L 31/0747* (2012.01)
*H01L 31/05* (2014.01)

(52) U.S. Cl.
CPC ............. *H01L 31/0747* (2013.01); *Y02E 10/50* (2013.01); *H01L 31/0512* (2013.01)

(58) Field of Classification Search
None
See application file for complete search history.

(56) References Cited

U.S. PATENT DOCUMENTS

| 5,158,618 A | 10/1992 | Rubin et al. |
| 2005/0115602 A1 | 6/2005 | Senta et al. |

FOREIGN PATENT DOCUMENTS

| EP | 0440869 A1 | 8/1991 |
| JP | 3448924 B2 | 7/2003 |
| JP | 2005-302902 A | 10/2005 |
| JP | 2006-080217 A | 3/2006 |
| JP | 2007-214533 A | 8/2007 |

*Primary Examiner* — Shannon Gardner
(74) *Attorney, Agent, or Firm* — Marvin A. Motsenbocker; Mots Law, PLLC

(57) ABSTRACT

In the solar cell module 100, the resin adhesive 12 includes a plurality of removed portions 12a on the principal surface of the photoelectric conversion part 20 by removing the resin adhesive 12 in a vertical direction. The plurality of removed portions 12a are formed in the row in cross directions K.

8 Claims, 8 Drawing Sheets

ARRANGEMENT DIRECTION H

CROSSING DIRECTION K

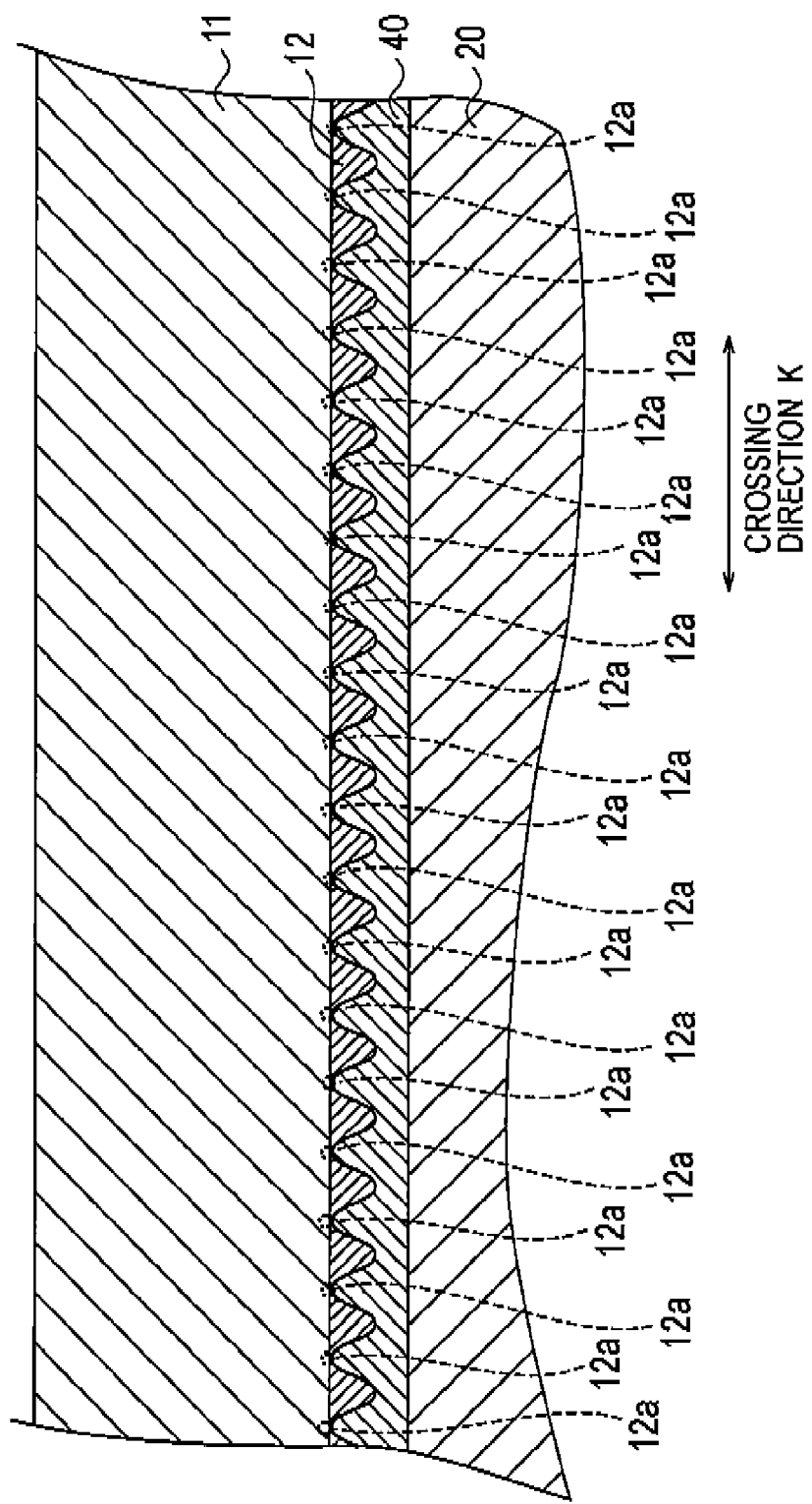

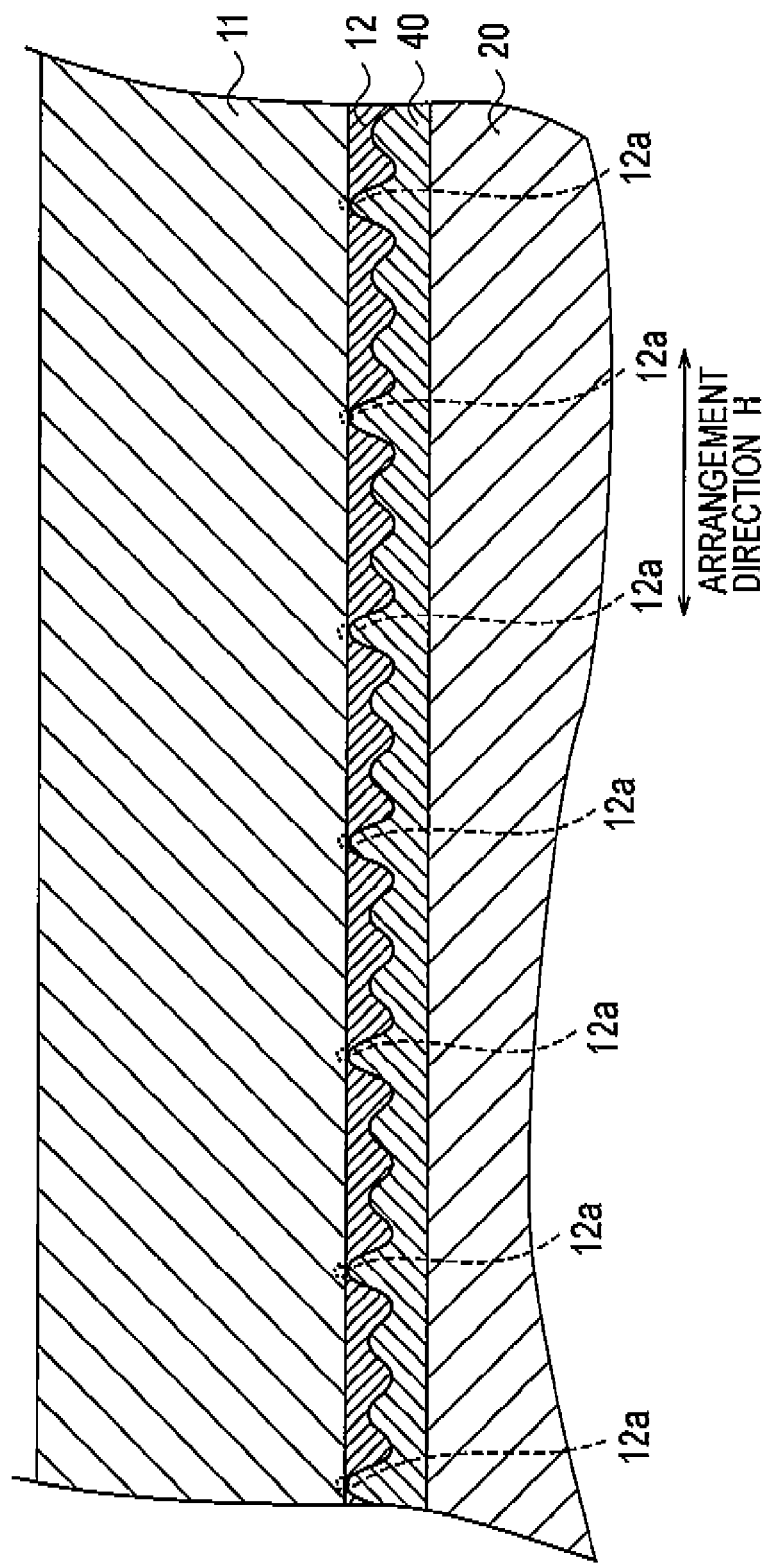

SOLAR CELL MODULE AND METHOD OF MANUFACTURING THE SAME

CROSS REFERENCE TO RELATED APPLICATIONS

This application is based upon and claims the benefit of priority from prior Japanese Patent Application No. 2007-338138, filed on Dec. 27, 2007; the entire contents of which are incorporated herein by reference.

BACKGROUND OF THE INVENTION

1. Field of the Invention

The present invention relates to a solar cell module including wiring members, and a method of manufacturing such a solar cell module.

2. Description of the Related Art

Expectation has been placed on solar cells as a new energy source because solar cells can convert clean, inexhaustibly supplied solar light directly into electricity.

Generally, a solar cell outputs electrical power of only several watts. For this reason, when a solar cell is used as a power supply for a house or a building, a solar cell module with the output power enhanced by electrically connecting a plurality of solar cells. The plurality of solar cells are arranged in arrangement directions, and are connected to each other by wiring members. The wiring members are each bonded to a connection electrode formed on a principal surface of a corresponding solar cell, and each has a rectangular shape in the arrangement directions.

As a technique for bonding the wiring members with the connection electrodes, the following has been proposed in which a resin adhesive capable of setting when heated at a temperature lower than the melting temperature of a solder is inserted between each wiring member and the corresponding connection electrode (see Japanese Patent Application Publication No. 2007-214533, for example). With this technique, an influence of temperature change on the solar cells during a step of connecting the wiring members to the connection electrodes can be smaller than that in a case of bonding the wiring members to the connection electrodes by soldering.

SUMMARY OF THE INVENTION

In the wiring member connecting step, the resin adhesives expand as the temperature increases, and then contracts as curing progresses. Accordingly, stress remains inside the resin adhesives after the connection of the wiring members.

Here, similar to the connection electrodes, the resin adhesives each have a rectangular shape in the arrangement directions. For this reason, the expansion and contraction of the resin adhesives in the arrangement directions is larger than that in the directions crossing the arrangement directions. Hence, large stress in the arrangement directions remains inside the resin adhesives.

Such stress may cause, over time, microscopic exfoliation in an interface between a resin adhesive and an wiring member or an interface between a resin adhesive and a connection electrode, and a microscopic crack inside a resin adhesive.

The present invention has been made in view of the above-described circumstance. An object of the present invention is to provide: a solar cell module in which a reduction in stress remaining inside a resin adhesive interposed between an wiring member and a connection electrode is possible; and a method of manufacturing the solar cell module.

A solar cell module according to the present invention includes: a first and a second solar cells aligning in an arrangement direction; and a wiring member configured to electrically connect the first and the second solar cells to each other. The first solar cell includes: a photoelectric conversion part and a connection electrode formed on a principal surface of the photoelectric conversion part. The wiring member is bonded to a surface of the connection electrode by use of a resin adhesive. The resin adhesive includes a plurality of removed portions formed by removing the resin adhesive in a direction vertical to the principal surface of the photoelectric conversion part.

In the solar cell module according to the present invention, the connection electrode maybe formed in the arrangement direction on the principal surface of the photoelectric conversion part.

In the solar cell module according to the present invention, the plurality of removed portions may be formed on a surface of the connection electrode.

In the solar cell module according to the present invention, the plurality of removed portions maybe formed in an interface between the resin adhesive and the connection electrode.

In the solar cell module according to the present invention, the connection electrode maybe in contact with the wiring member in each of the plurality of removed portion.

The connection electrode includes a plurality of convex parts, each of the plurality of convex parts may be in contact with the wiring member in the each of the plurality of removed portions.

The wiring member includes a conductive layer forming a surface of the wiring members. In the each of the plurality of removed portions, the plurality of convex parts are dented in the conductive layer.

The resin adhesive may include insulating filler.

A method of manufacturing a solar cell module according to the present invention is the method of manufacturing a solar cell module includes: a first and second solar cells aligning an arranged direction; and a wiring member configured to electrically connect the first and the second solar cells to each other. The method includes steps of: forming a connection electrode on a principal surface of a photoelectric conversion part of the first solar cell; and bonding the wiring member on a surface of the connection electrode by used of a resin adhesive. In the bonding step, a plurality of removed portions are formed by removing the resin adhesive in a direction vertical to the principal surface of the photoelectric conversion part.

In the method of manufacturing a solar cell module according to the present invention, in the bonding step, the plurality of removed portions maybe formed on a surface of the connection electrode.

In the method of manufacturing a solar cell module according to the present invention, in the forming step, a plurality of convex parts maybe formed on a surface of the connection electrode, and in the bonding step, the plurality of convex parts may be in contact with the wiring member by mutually pressing the wiring member and the first solar cells.

In the method of manufacturing a solar cell module according to the present invention, in the bonding step, the plurality of removed portions may be formed in a row crossing the arrangement direction.

A solar module according to the present invention includes: In the and a wiring member steps of: a first and a second solar cells aligning in an arrangement direction; and a wiring member configured to electrically connect the first and the second solar cells to each other. The first solar cell includes: a photoelectric conversion part; and a connection electrode formed on a principal surface of the photoelectric conversion part. The wiring member is bonded to a surface of the connection electrode by use of a resin adhesive, the resin adhesive includes a plurality of removed portions formed by removing the resin adhesive in an interface between the resin adhesive and the wiring member.

In the solar cell module according to the present invention, the resin adhesive may include the plurality of removed portions on a surface of the connection electrode.

BRIEF DESCRIPTION OF THE DRAWINGS

FIG. 7 is an enlarged cross-sectional view taken along a line C-C in FIG. 6.

FIG. 8 is an enlarged cross-sectional view taken along a line D-D in FIG. 6.

DESCRIPTION OF THE PREFERRED EMBODIMENT

Figure 1:
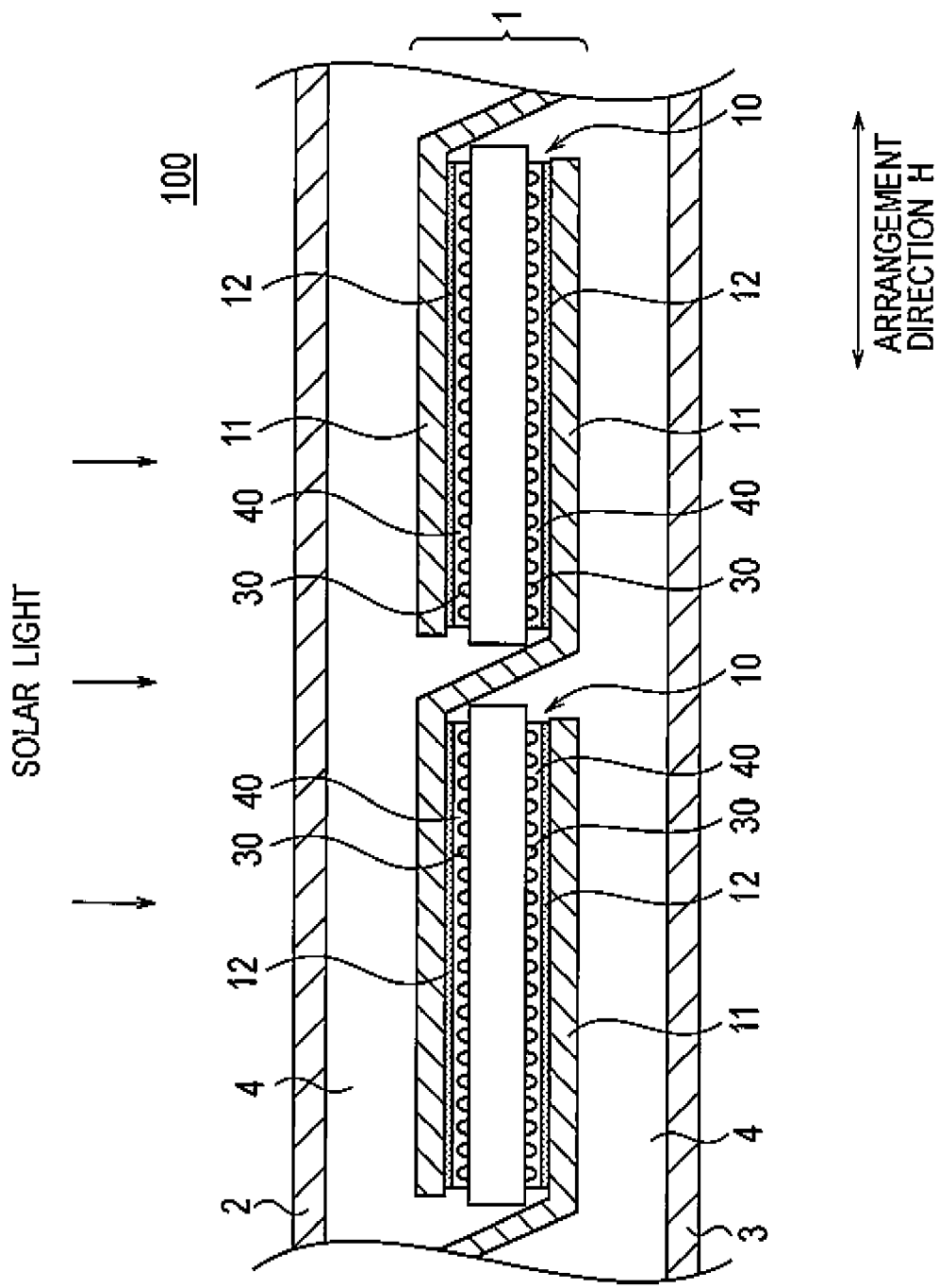
FIG. 1 is a side view of a solar cell module 100 according to an embodiment of the present invention.

Next, with reference to the drawings, an embodiment of the present invention will be described. In the drawings, identical or similar components are denoted by identical or similar reference numerals. It should be noted, however, that the drawings are schematic, and that the dimensional proportions and the like are different from their actual values. Accordingly, specific dimensions and the like should be inferred based on the description given below. Moreover, dimensional relationships and dimensional proportions may be different from one drawing to another in some parts.

(Overall Configuration of Solar Cell Module)

An overall configuration of a solar cell module 100 according to this embodiment of the present invention will be described with reference to FIG. 1. FIG. 1 is an enlarged side view of the solar cell module 100 according to this embodiment.

The solar cell module 100 includes a solar cell string 1, a light-receiving-surface-side protective member 2, a back-surface-side protective member 3 and a sealer 4. The solar cell module 100 is configured so that the sealer 4 seals the solar cell string 1 between the light-receiving-surface-side protective member 2 and the back-surface-side protective member 3.

The solar cell string 1 includes a plurality of solar cells 10, wiring members 11 and resin adhesive 12, and is configured so that the multiple solar cells 10 arranged in arrangement directions H are connected to each other by the wiring members 11.

The solar cells 10 each include a light-receiving surface on which solar light enters and a back surface provided on the opposite side of the light-receiving surface. Here, the light-receiving surface and the back surface are principal surfaces of the solar cell 10. Collecting electrodes are formed on the light-receiving surface and the back surface of the solar cells 10, respectively. Thin-wire electrodes 30 and connection electrodes 40 are formed on the light-receiving surface and the back surface of the solar cells 10. The configuration of the solar cell 10 will be described later in detail.

The wiring members 11 electrically connect the first and second solar cells 10 to each other. Specifically, the wiring member 11 is connected to the connection electrode 40 formed on the light-receiving surface of first solar cell 10 and the connection electrode 40 formed on the back surface of second solar cell 10 adjacent to the first solar cell 10. Thus, the first solar cell 10 and the second solar cell 10 are electrically connected to each other. The wiring members 11 are made of a low-resistance layer such as copper in a thin plate shape and a conductive layer, such as solder, formed on a surface of the low-resistance layer.

The resin adhesive 12 is interposed between the wiring member 11 and the connection electrode 40. In other words, the wiring member 11 is connected to the connection electrode 40 by the resin adhesive 12. The resin adhesive 12 is preferably capable of setting when heated at a temperature equal to or lower than the melting point of the eutectic solder, for example, equal to or lower than approximately 200° C. Examples of a material that can be used as the resin boding material 12 are an acrylic resin, a thermosetting polyurethane resin adhesive with high flexibility, and a two-component adhesive which is a mixture of a setting agent and one of an epoxy resin, an acrylic resin and an urethane resin. In this embodiment, a band-shaped (rectangular) film sheet adhesive containing an epoxy resin as a principal component is used as the resin adhesive 12. Here, the resin adhesive 12 may contain at least one of conductive filler and insulating filler. Nickel or gold-coated nickel can be used as the conductive filler.

The light-receiving-surface-side protective member 2 is provided on the light-receiving surface side of the sealer 4 to protect the top surface of the solar cell module 10. Examples of a material that can be used as the light-receiving-surface-side protective member 2 are a translucent, water-impermeable glass and a translucent plastic.

The back-surface-side protective member 3 is provided on the back surface side of the sealer 4 to protect the back surface of the solar cell module 100. Examples of a material that can be used as the back-surface-side protective member 3 are a resin film such as a PET (polyethylene terephthalate), and a laminated film having a structure in which an Al foil is sandwiched by resin films.

The sealer 4 seals the solar cell string 1 between the light-receiving-surface-side protective member 2 and the back-surface-side protective member 3. Examples of a material that can be used as the sealer 4 are translucent EVA, EEA, PVB, silicon, urethane, acrylic and epoxy resins.

An Al frame (not illustrated) can be provided around the outer periphery of the solar cell module 100 having the above-described configuration.

(Configuration of Solar Cell)

Figure 2:
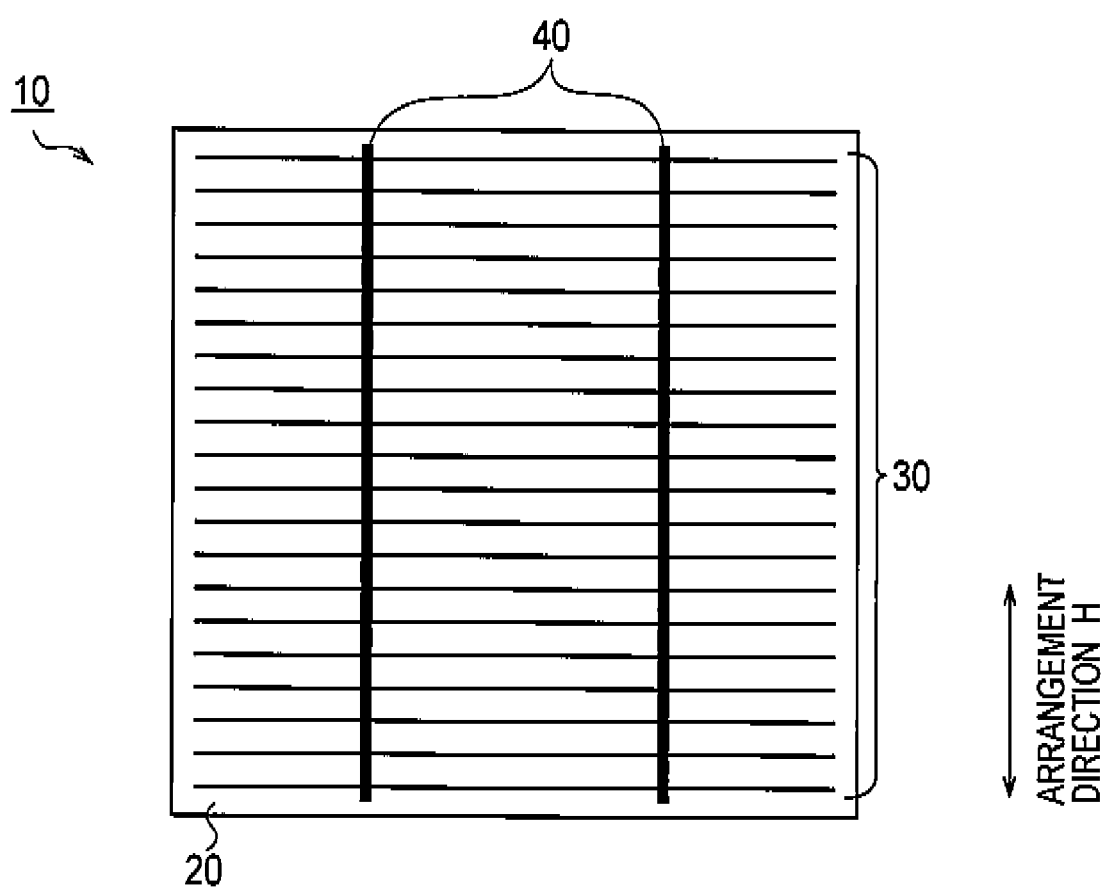
FIG. 2 is a plane view of a solar cell 10 according to the embodiment of the present invention.

Next, a configuration of the solar cell 10 will be described with reference to FIG. 2. FIG. 2 is a plan view of a light-receiving surface of the solar cell 10.

The solar cell 10 includes a photoelectric conversion part 20, the plurality of thin-wire electrodes 30 and the connection electrodes 40 as shown in FIG. 2.

The photoelectric conversion part 20 generates photo-generated carriers by receiving light at a main surface of the photoelectric conversion part 20. The photo-generated carriers include holes and electrons generated from solar light absorbed by the photoelectric conversion part 20. The photoelectric conversion part 20 includes therein an n-type region and a p-type region, and a semiconductor junction is formed at an interface between the n-type region and the p-type region. An example of a material that can be used to form the photoelectric conversion part 20 is a semiconductor substrate made of a crystal semiconductor material, such as a single-crystal Si or polycrystalline Si semiconductor material, or a compound semiconductor material, such as a GaAs or InP semiconductor material. Here, the photoelectric conversion part 20 may have a structure in which an improvement is made in the characteristics of a heterojunction interface by interposing a substantially intrinsic amorphous silicon layer between a single-crystal silicon substrate and an amorphous silicon layer, that is, a HIT structure.

The thin wire electrodes 80 collect the photo-generated carriers generated by the photoelectric conversion part 20. As shown in FIG. 2, the plurality of thin wire electrodes 30 are each formed in directions crossing the arrangement directions H, on the photoelectric conversion part 20. The thin wire electrodes 30 can be formed by using a conductive resin paste using a resin material as a binder and conductive particles such as silver particles as fillers. Here, as shown in FIG. 1, the thin wire electrodes 30 are formed similarly both on the light-receiving surface and the back surface of the photoelectric conversion part 20. The number of the thin wire electrodes 30 may be appropriately set in consideration of the size of the photoelectric conversion part 20 and the like. For example, when the photoelectric conversion part 20 is 100 mm square, approximately 50 thin wire electrodes 30 can be formed.

The connection electrodes 40 are electrodes to which the wiring members 11 are connected. As shown in FIG. 2, the connection electrodes 40 are each formed in the arrangement directions H, on the photoelectric conversion part 20. Accordingly, the connection electrodes 40 cross the plurality of thin wire electrodes 30. The connection electrodes 40, as the thin wire electrodes 30, can be formed by using a conductive resin paste using a resin material as a binder and conductive particles such as silver particles as fillers. As shown in FIG. 1, the connection electrodes 40 are also formed on the back surface of the photoelectric conversion part 20. The number of the connection electrodes 40 may be appropriately set in consideration of the size of the photoelectric conversion part 20 and the like. For example, when the photoelectric conversion part 20 is 100 mm square, two connection electrodes 40 each having a width of approximately 1.5 mm can be formed.

The connection electrodes 40 can be formed by a printing technique such as screen printing. A screen used in the screen printing includes wires stretched in a grid pattern forming meshes. Here, the meshes are blocked off with an emulsion although those corresponding to the regions where the connection electrodes 40 are to be formed lack the emulsion. The conductive resin paste is forced out onto the photoelectric conversion part 20 through the meshes lacking of the emulsion. As a result, concaves and convexes corresponding to the meshes are formed in surfaces of the connection electrodes 40.

Figure 3:
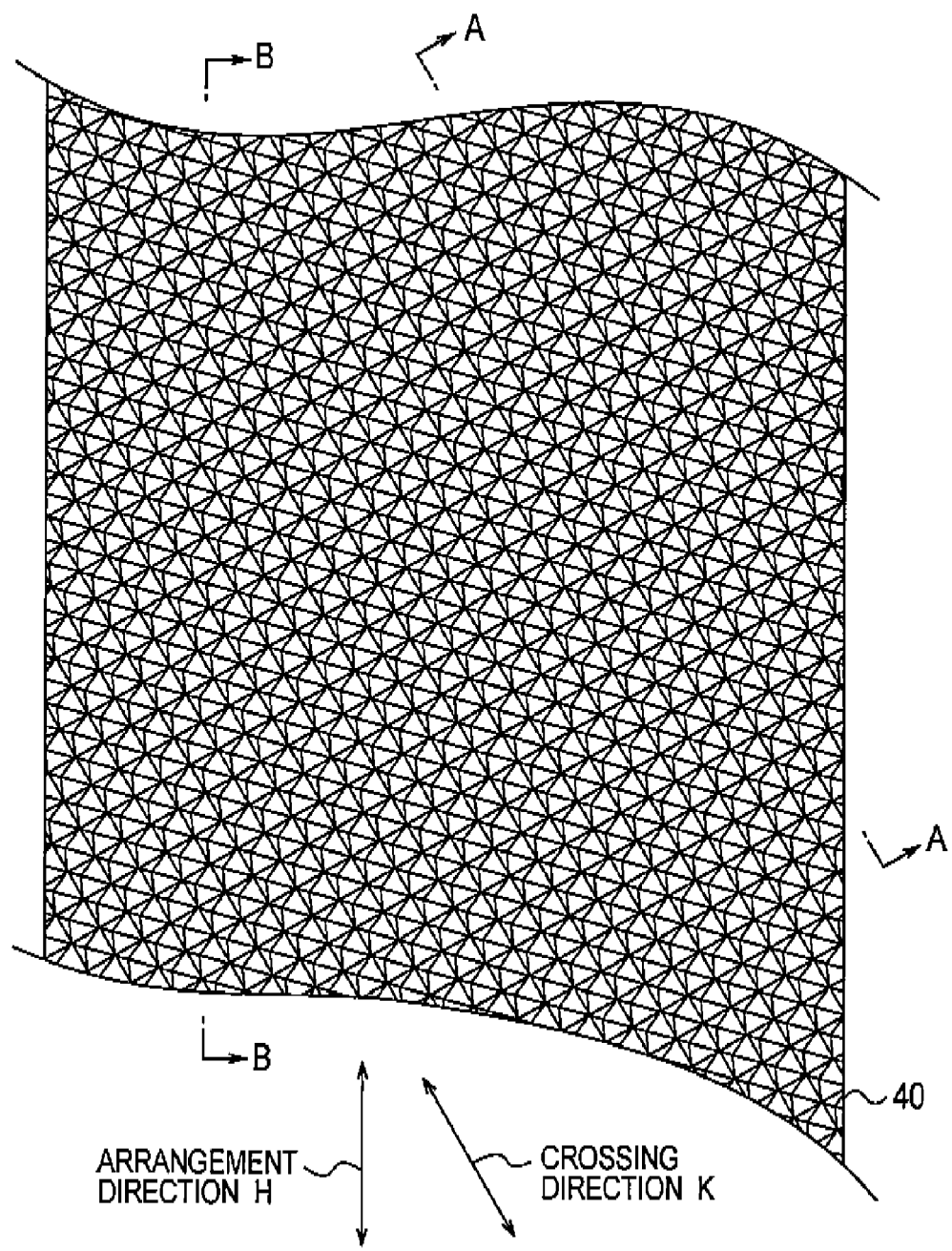
FIG. 3 is an enlarged plane view of a connection electrode 40.

FIG. 3 is an enlarged plan view schematically showing the connection electrode 40 shown in FIG. 2. As shown in FIG. 3, a plurality of microscopic concave and convex parts are formed in the surface, to which the wiring member 11 is connected, of the connection electrode 40. Here, the convexes lie in a row in cross directions K crossing the arrangement directions H, so as to avoid a situation in which the wires forming the meshes overlap the positions where the thin wire electrodes 30 are to be printed in screen printing for printing the connection electrodes 40 and the thin wire electrodes 30 at the same time. In FIG. 3, a bias angle M formed by the cross directions K with the arrangement directions H is set at approximately 30°, although not limited thereto. When the wires forming the meshes are not likely to overlap the positions where the thin wire electrodes 30 are to be printed, the bias angle M may be set at 90°. In this case, the plurality of convex parts formed in the surface of the connection electrode 40 lie in a row in the directions orthogonal to the arrangement directions H.

Figure 4:
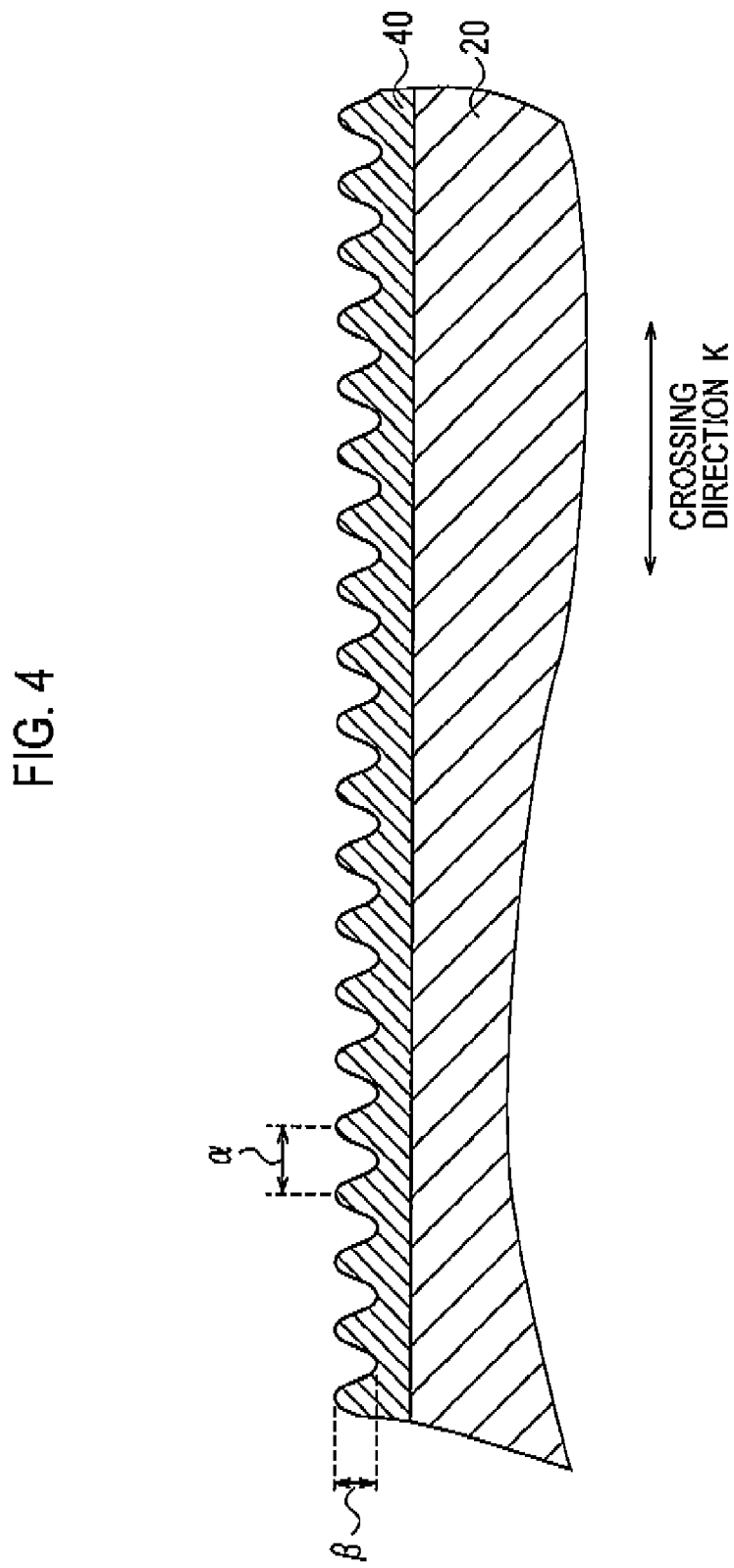
FIG. 4 is an enlarged cross-sectional view taken along a line A-A in FIG. 3.

FIG. 4 is an enlarged cross-sectional view taken along a line A-A (a line in the cross directions K) in FIG. 3. When a general screen is used, a pitch $\alpha$ of the plurality of convex parts formed in the surface of the connection electrode 40 is approximately 30 μm while a height $\beta$ of each convex in a direction vertical to the main surface of the photoelectric conversion part 20 is approximately 5 to 20 μm. As shown in FIG. 4, the convexes having approximately the same height are formed in a row along the cross directions K.

Figure 5:
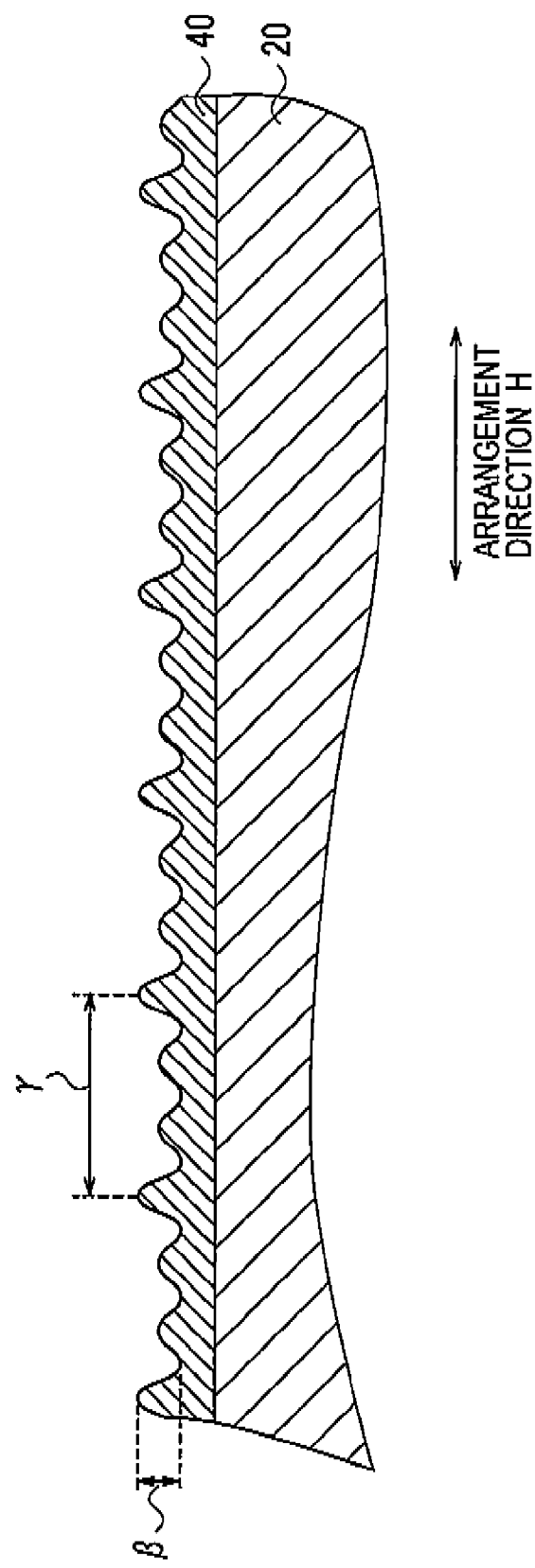
FIG. 5 is an enlarged cross-sectional view taken along a line B-B in FIG. 3.

FIG. 5 is an enlarged cross-sectional view taken along a line B-B (a line in the arrangement directions H) in FIG. 3. As shown in FIG. 5, the convexes in the arrangement directions H have different heights. A pitch $\gamma$ of the convexes having the height $\beta$ is approximately 100 μm.

(Configuration of Solar Cell String)

Figure 6:
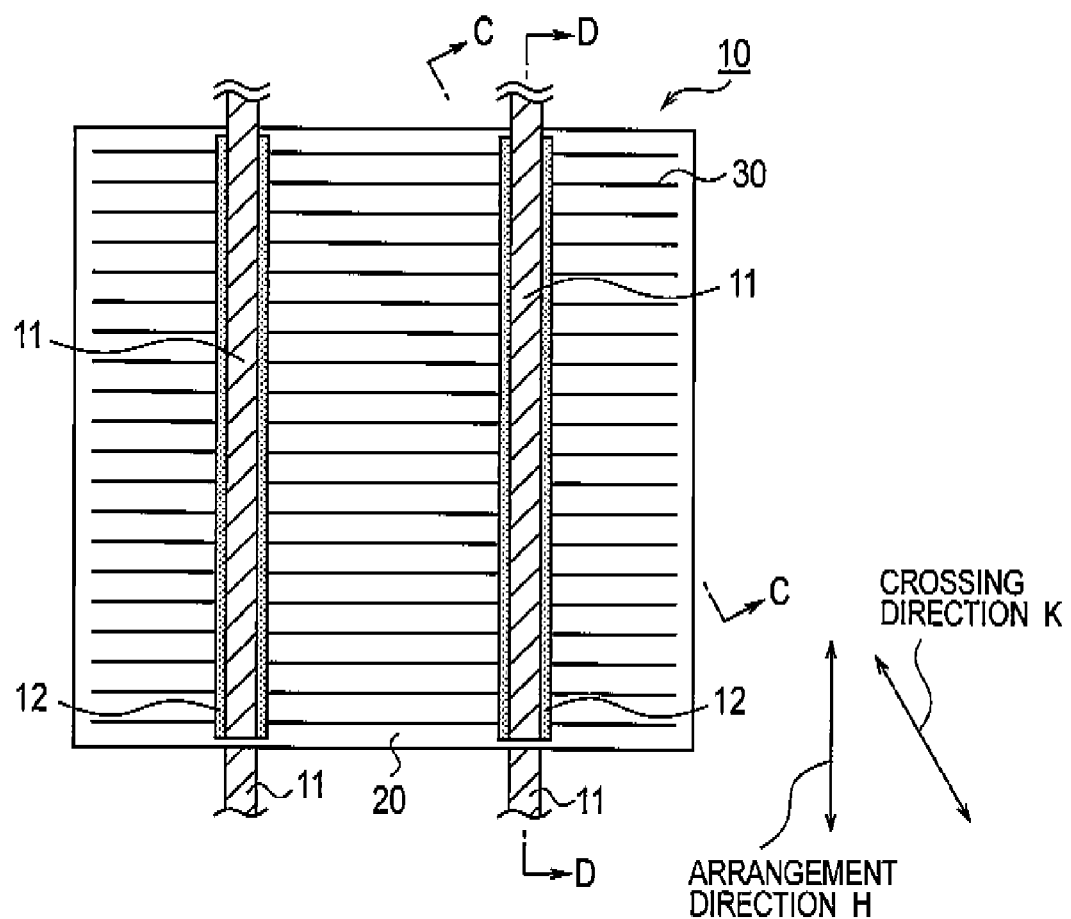
FIG. 6 is a plane view of a solar cell string 1 according to the embodiment of the present invention.

Next, a configuration of the solar cell string 1 will be described with reference to FIG. 6 to FIG. 8. FIG. 6 shows a state in which the wiring members 11 are bonded to the connection electrodes 40 shown in FIG. 2, with the resin adhesives 12 interposed there between.

As shown in FIG. 6, the wiring members 11 are disposed on the connection electrodes 40 each formed in a line shape in the arrangement directions H. The resin adhesive 12 is interposed between the wiring member 11 and the connection electrode 40. Accordingly, the resin adhesive 12 is provided in the arrangement directions H, on the connection electrode 40. Although the width of the resin adhesive 12 is larger than that of the wiring member 11 in FIG. 6, the widths of the resin adhesive 12 and the wiring member 11 may be approximately the same.

FIG. 7 is an enlarged cross-sectional view taken along a line C-C (a line in the cross directions K) in FIG. 6. Specifically, FIG. 7 shows a state in which the connection electrode 40, the resin adhesive 12 and the wiring members 11 are disposed on the photoelectric conversion part 20 in this order. As shown in FIG. 7, the resin adhesive 12 includes a plurality of formed by removing the resin adhesive 12 in a direction vertical to the main surface of the photoelectric conversion part 20.

The plurality of removed portions 12a are formed by causing the plurality of convex parts, formed along the line in the cross directions K in the surface of the connection electrode 40, to be dented in the conductive layer of wiring members 11. Therefore, the plurality of removed portions 12a are formed in an interface between the 12 and the connection electrode 40. In each of the plurality of removed portions 12a, the connection electrode 40 is in contact with the wiring member 11. Contact surfaces of the contact electrode 40 and the wiring members 11 are each in a circular shape having a diameter of 3 μmϕ to 20 μmϕ.

FIG. 8 is an enlarged cross-sectional view taken along a line D-D (a line in the arrangement directions H) in FIG. 6. As shown in FIG. 8, the removed portions 12a are formed at predetermined intervals in the arrangement directions H. In other words, the resin adhesive 12 is microscopically sectioned at the predetermined intervals in the arrangement directions H by the removed portions 12a.

(Method of Manufacturing Solar Cell Module)

Next, an example of a method of manufacturing the solar cell module 100 according to this embodiment will be described.

First, anisotropic etching is performed on an n-type single-crystal silicon substrate of 100 mm square by using an alkaline solution, to form the plurality of microscopic convex parts on a light-receiving surface side of the n-type single-crystal silicon substrate.

Then, an i-type amorphous silicon layer and a p-type amorphous silicon layer are sequentially stacked on the light-receiving surface side of the n-type single-crystal silicon substrate by a CVD (chemical vapor deposition) method. Similarly, an i-type amorphous silicon layer and an n-type amorphous silicon layer are sequentially stacked on a back surface side of the n-type single-crystal silicon substrate.

Subsequently, an ITO film is formed on the light-receiving surface side of the p-type amorphous silicon layer by using a PVD (physical vapor deposition) method. Similarly, an ITO film is formed on the back surface side of the n-type amorphous silicon layer. Thus, a photoelectric conversion part 20 is formed.

Next, a predetermined pattern is formed with a thermosetting epoxy silver paste on each of the light-receiving surface and the back surface of the photoelectric conversion part 20 by a printing technique such as screen printing. Here, the predetermined pattern is the grid pattern shown in FIG. 2 formed by the two connection electrodes 40 each extending in the arrangement directions H and the multiple thin wire electrodes 30 crossing the connection electrodes 40.

Thereby, the plurality of convex parts corresponding to the shapes of the meshes used in the screen printing are formed in the surfaces of the connection electrodes 40. A bias angle formed by the directions in which wires extend with squeegee directions of the printing (arrangement directions H) is set at a predetermined angle. Thus, the plurality of convex parts are continuously formed in the directions (the cross directions K) crossing the squeegee directions (arrangement directions H).

Then, the silver pastes are caused to set by being heated under a predetermined condition. Thus, the solar cell 10 is formed.

Next, by the resin adhesive 12, the wiring members 11 are each bonded to the corresponding connection electrode 40. By this bonding, the wiring members 11 and the solar cell 10 are mechanically and electrically connected to each other. Specifically, first, the resin adhesive 12 and the wiring member 11 are sequentially disposed on each of the connection electrodes 40 formed on the light-receiving surface and the back surface of the photoelectric conversion part 20. Then, the wiring members 11 and the solar cell 10 are mutually pressed. Specifically, the wiring members 11 are pressed toward the solar cell 10 by using a heater block heated to approximately 200° C. In this event, the plurality of convex parts formed in the surfaces of the connection electrodes 40 are caused to dent in the soft conductive members provided on the wiring members 11. Thereby, the parts of the resin adhesive 12 are removed in the direction vertical to the main surface of the photoelectric conversion part 20, to form the plurality of removed portions 12a in the surface of the connection electrodes 40. Since the plurality of convex parts are formed along the cross directions K crossing the arrangement directions H, the resin adhesive 12 is microscopically sectioned at predetermined intervals in the arrangement directions H.

Through the above process, the solar cell string 1 is formed.

Next, an EVA sheet (sealer 4), the solar cell string 1, an EVA sheet (sealer 4) and the PET sheet (back-surface-side protective member 3) are sequentially stacked on a glass substrate (light-receiving-surface-side protective member 2), to form a stacked body.

Thereafter, thermo-compression bonding is performed on the stacked body in a vacuum atmosphere, to cause the EVAs to set. Thus, the solar cell module 100 is manufactured.

Here, the solar cell module 100 may be provided with a terminal box or an Al frame.

Advantageous Effects

In the solar cell module 100 according to this embodiment, the resin adhesive 12 includes the plurality of removed portions 12a formed by removing the resin material 12 in the direction vertical to the main surface of the photoelectric conversion part 20. The removed portions 12a lie in a row in directions (the cross directions K) crossing the arrangement directions H.

As described above, the resin adhesive 12 includes the plurality of removed portions 12a lain in the row in directions (the cross direction K) crossing the arrangement directions H. Thus, the macromolecules constituting the resin adhesive 12 are divided by the plurality of removed portions 12a in the arrangement directions H. With this configuration, stress in the arrangement directions H remaining inside the resin adhesive 12 can be reduced. As a result, microscopic exfoliation in an interface between the resin adhesive 12 and the wiring member 11 or an interface between the resin adhesive 12 and the connection electrode 40, or a microscopic crack inside the resin adhesive 12, which is likely to occur over time, can be prevented.

In the method of manufacturing the solar cell module 100 according to this embodiment, the wiring members 11 and the solar cell 10 are mutually pressed. Thereby, the plurality of the convex parts are caused to dent in the conductive layer in the wiring member 11, and the plurality of removed portions 12a are consequently formed. In addition, the connection electrode 40 and the wiring member 11 are in contact with each other directly, and are thus electrically connected.

Furthermore, in the method of manufacturing the solar cell module 100 according to this embodiment, the connection electrodes 40 are formed by screen printing. Accordingly, microscopic concaves and convexes can be formed in the surfaces of the connection electrodes 40 by making use of the meshes of the screen. This means that a step of forming the plurality of convex parts in the surfaces of the electrodes 40 does not need to be added, so that the productivity of the solar cell module 100 can be maintained.

Other Embodiments

Although the present invention has been described on the basis of the above embodiment, the description and the drawings, which constitute part of this disclosure, should not be understood to limit this invention. Various alternative embodiments, examples and operation techniques will be apparent to those skilled in the art from this disclosure.

For example, in the above embodiment, the plurality of convex parts formed in the surfaces of the connection electrodes 40 by screen printing are used to form the removed portions 12a. However, the plurality of convex parts may be formed by mechanically processing the connection electrodes 40. Alternatively, microscopic convexes may be formed by iteratively applying a conductive paste on the surfaces of the connection electrodes 40 multiple times.

In the above embodiment, the multiple removed portions 12a are formed to lie intermittently in a row crossing the arrangement directions H. However, the removed portions 12a may be formed so as to continue at a predetermined height. In the present invention, the removed portions 12a may have any shape as long as being capable of microscopically sectioning the resin adhesive 12 in the arrangement directions H. Accordingly, the removed portions 12a do not need to be arranged in a straight line. Moreover, the removed portions 12a do not need to be formed over the entire width of the resin adhesive 12. As long as the removed portions 12a lie in a row in the cross directions K, the effects of the present invention can be obtained.

In the above embodiment, the plurality of regularly aligned convex parts are formed in the surfaces of the connection electrodes 40. However, as long as the removed portions 12a lying in a row crossing the arrangement directions H can be formed, the pitches, the heights and the like of the convexes may be irregular.

In the above embodiment, the connection electrodes 40 are each formed as a single continuous electrode in the arrangement directions H. However, the connection electrode 40 may be separated into several pieces in the arrangement directions H. No limitation is imposed on the surface shapes of the connection electrodes 40 in the present invention.

In the above embodiment, the multiple separated thin wire electrodes 30 are formed on the back surface of each of the photoelectric conversion part 20. However, the thin wire electrodes 30 may be formed so as to cover the entire back surface of the photoelectric conversion part 20. No limitation is imposed on the shapes of the thin wire electrodes 30 formed on the back surface of each of the photoelectric conversion part 20.

Thus, it is obvious that the present invention includes various embodiments and the like not described herein. Therefore, the technical scope of the present invention is to be determined only by claimed elements of the present invention according to the scope of claims reasonably understood from the above description.

Example

A concrete example of a solar cell module according to the present invention will be described below. However, the present invention is not to be limited to the following example, and can be implemented with alternations made as appropriate within the scope of the invention.

Example

Firstly, each photoelectric conversion part is made by using an n-type single-crystal silicon substrate of 100 mm square.

Thin wire electrodes and connection electrodes are formed in a grid pattern on a light-receiving surface and a back surface of the photoelectric conversion part by screen printing using thermosetting epoxy silver paste. Each connection electrode is set to have a thickness (height) of 50 μm and a width of 1.5 mm.

Thereafter, wiring members each formed of a flat copper foil of 1.5 mm width the surface of which is plated with a SnAgCu solder are prepared.

Then, an epoxy resin adhesive is applied to the connection electrodes formed on the light-receiving surface of first solar cell and the connection electrodes formed on the back surface of a different solar cell adjacent to the first solar cell. As the epoxy resin adhesive, a kneaded material containing 10000 nickel particles per 1 mm$^3$ epoxy resin is used.

Subsequently, the wiring member is disposed on each epoxy resin adhesive, and a pressure of 2 Map is applied to the wiring member from above or below by a metal head heated to 200° C., for 60 seconds. Thereby, removed portions in each of which part of the resin adhesive is removed in a direction vertical to the main surface of the photoelectric conversion part are formed in the resin adhesive by the plurality of the convex parts formed on a surface of the connection electrode. In addition, the connection electrode and the wiring member come in contact with each other in the removed portions. The area of the region where the connection electrode and the wiring member are in contact in each removed portion is approximately 3 μmφ to 30 μmφ.

Thus, a solar cell string according to this example is manufactured. Then, the solar cell string is disposed between a glass and a PET film and is sealed with an EVA there between, so that a solar cell module is manufactured.

Comparative Example 1

Next, a solar cell module according to a first comparative example is manufactured. The manufacturing method of the first comparative example is different from the manufacturing method of the above example in that a pressure of 0.25 Map is applied to each wiring member by a metal head. The other steps axe the same as the above example.

Comparative Example 2

Next, a solar cell module according to a second comparative example is manufactured. The manufacturing method of the second comparative example is different from the manufacturing method of the above example in that a wiring member is soldered to each connection electrode, instead of using a resin adhesive. Specifically, a wiring member coated with an organic acid flux is disposed on each connection electrode, and a hot wind of 300° C. is applied to the wiring member to melt the solder. The other steps are the same as the above example.

(Output Measurement)

The measurement results of the example, the first comparative example and the second comparative example are shown in Table 1 in the form of the output of solar cell string/output of solar cell.

TABLE 1

| | Output of solar cell string/ output of solar cell (%) |
|---|---|
| Example | 98.1 |
| Comparative Example 1 | 98.0 |
| Comparative Example 2 | 97.5 |

As shown in Table 1, in the second comparative example, output significantly decreased after the wiring member connecting step. Such a significant decrease occurred because the series resistance between each wiring member and the corresponding connection electrode increased due to the residue of the flux applied to the wiring member. On the other hand, in each of the example and the first comparative example where the wiring members were connected by using a resin adhesive, only a small decrease was found in the output after the wiring member connecting step.

(Temperature Cycling Test)

A temperature cycling test is performed on each of the solar cell modules according to the example, the first comparative example and the second comparative example, by using a thermostatic bath.

The temperature cycling test was performed in accordance with JIS C 8917. Specifically, each sample was held in the thermostatic bath to increase the temperature of the sample from 25° C. to 90° C. over a period of 45 minutes, and was then held at this temperature for 90 minutes. Thereafter, the temperature of the sample was decreased to −40° C. over a period of 90 minutes, and was then held at this temperature for 90 minutes. Thereafter, the temperature of the sample was increased to 25° C. over a period of 45 minutes. 200 cycles, each consisting of the above-described steps (6 hours), were performed on each sample.

The measurement results of the outputs of each solar module before and after the test are shown in Table 2.

TABLE 2

| | Output after test/output before test (%) |
|---|---|
| Example | 99.0 |
| Comparative Example 1 | 97.5 |
| Comparative Example 2 | 98.7 |

As shown in Table 2, in the first comparative example, output significantly decreased after the temperature cycle test. Such a significant decrease occurred due to the following reason. Since the plurality of convex parts formed in the surface of each connection electrode and the wiring member were in contact at very few regions, the resin adhesive was sectioned at almost no regions. Accordingly, stress resulting from temperature changes in the temperature cycle test, besides stress remaining inside the resin adhesive, affected the resin adhesive, so that damages to the resin adhesive were accumulated. In the first comparative example, bringing about such a result, the electrical connection between each connection electrode and a wiring member was made by nickel particles kneaded with an epoxy resin.

In the example, on the other hand, only a small change was found in the outputs before and after the temperature cycling test. This is because the plurality of convex parts formed in the surface of the connection electrode dented in the wiring member due to a large pressure applied to the wiring member in the thermo-compression bonding, so that the resin adhesive was microscopically sectioned. In other words, the macromolecules constituting the resin adhesive are divided by the plurality of the convex parts, and the stress remaining inside the resin adhesive could be reduced consequently. Here, the resin adhesive is microscopically sectioned in a row crossing longitudinal directions of the resin adhesive, which led to a reduction in stress especially in the longitudinal directions of the resin adhesive.

What is claimed is:

1. A solar cell module comprising:
   first and second solar cells aligned in an arrangement direction; and
   a wiring member configured to electrically connect the first and the second solar cells to each other, wherein
   the first solar cell includes a photoelectric conversion part and a connection electrode formed on a first principal surface of the photoelectric conversion part,
   the connection electrode directly and periodically contacting the wiring member via tops of convex shapes with a set periodicity at the surface of the connection electrode; wherein
   the periodic contact surfaces are arranged in parallel rows that cross the arrangement direction at a bias angle,
   and the wiring member is further mechanically bonded to the connection electrode surface by resin adhesive surrounding the contact surfaces.

2. The solar cell module of claim 1, wherein the contact surfaces are circular and have diameters of between 3 microns to 20 microns.

3. The solar cell module according to claim 1, wherein the connection electrode is formed along the arrangement direction on the first principal surface.

4. The solar cell module according to claim 2, wherein, the wiring member has a conductive layer surface, and each concave shape forms a dent in the conductive layer.

5. The solar cell module according to claim 1, wherein the bias angle is approximately 30 degrees.

6. The solar cell module according to claim 1, wherein the bias angle is substantially orthogonal to the arrangement direction.

7. The solar cell module according to claim 1, wherein the set periodicity is approximately 100 microns.

8. The solar cell module according to claim 1, wherein the connection electrode surface is completely filled by concave shapes aligned in regular rows in two dimensions.

* * * * *